US012744180B2

(12) United States Patent
Wu et al.

(10) Patent No.: US 12,744,180 B2
(45) Date of Patent: Sep. 22, 2026

(54) METHOD AND SYSTEM FOR ANALYZING THREE-DIMENSIONAL FEATURES

(71) Applicant: FEI Company, Hillsboro, OR (US)

(72) Inventors: Bingxing Wu, Shanghai (CN); Zhenxin Zhong, Portland, OR (US); Chunxiao Liu, Shandong (CN)

(73) Assignee: FEI Company, Hillsboro, OR (US)

( * ) Notice: Subject to any disclaimer, the term of this patent is extended or adjusted under 35 U.S.C. 154(b) by 376 days.

(21) Appl. No.: 18/128,223

(22) Filed: Mar. 30, 2023

(65) Prior Publication Data

US 2023/0317410 A1 Oct. 5, 2023

(51) Int. Cl.

| | |
|---|---|
| ***H01J 37/305*** | (2006.01) |
| ***H01J 37/20*** | (2006.01) |
| ***H01J 37/22*** | (2006.01) |
| ***H01J 37/244*** | (2006.01) |
| ***H01J 37/26*** | (2006.01) |
| ***H01J 37/28*** | (2006.01) |

(52) U.S. Cl.

CPC .......... *H01J 37/3056* (2013.01); *H01J 37/20* (2013.01); *H01J 37/222* (2013.01); *H01J 37/244* (2013.01); *H01J 37/265* (2013.01); *H01J 37/28* (2013.01); *H01J 2237/31749* (2013.01)

(58) Field of Classification Search

CPC ........ H01J 37/00; H01J 37/3056; H01J 37/20; H01J 37/02; H01J 37/26; H01J 37/28; H01J 37/222; H01J 37/244; H01J 37/265; H01J 37/05; H01J 2237/31749; H01J 2237/226; H01J 2237/2813; G01N 2223/418; G01N 23/225; G01N 23/2202; G06Y 17/20; G06T 7/33; G06T 2207/10061; G06V 10/46; G06V 10/761

USPC .......................................... 250/306, 307, 311

See application file for complete search history.

(56) References Cited

U.S. PATENT DOCUMENTS

| | | | | |
|---|---|---|---|---|
| 8,288,737 | B1 * | 10/2012 | Walck | H01J 37/20 250/311 |
| 2005/0139768 | A1 * | 6/2005 | Bloess | G01N 23/2206 250/492.2 |
| 2013/0081882 | A1 * | 4/2013 | Lin | G01N 1/32 175/428 |
| 2014/0217283 | A1 * | 8/2014 | Blackwood | H01J 37/261 250/311 |
| 2015/0348751 | A1 * | 12/2015 | Brogden | H01J 37/3023 250/307 |
| 2016/0322194 | A1 * | 11/2016 | Kooijman | H01J 37/265 |
| 2022/0207698 | A1 * | 6/2022 | Zhong | G06T 7/0004 |

* cited by examiner

*Primary Examiner* — Jason L Mccormack

(74) *Attorney, Agent, or Firm* — Bo Wang

(57) ABSTRACT

Multiple features in a sample are analyzed based on a first sample image of a first surface and a second sample image of a second surface. The first surface includes cross-sections of the multiple features, and the second surface includes cross-sections of the multiple features at different sample depths relative to the first surface. The second surface formed by milling the sample to remove at least a part of the first surface. A 3D model of the multiple features is constructed by comparing the cross-sections of multiple features in the second image and corresponding cross-sections of the multiple features in the first image.

19 Claims, 8 Drawing Sheets

METHOD AND SYSTEM FOR ANALYZING THREE-DIMENSIONAL FEATURES

FIELD OF THE INVENTION

The present description relates generally to methods and systems for analyzing three-dimensional (3D) features, and more particularly, to generating 3D models of multiple features of a sample using charged particle tools.

BACKGROUND OF THE INVENTION

Many semiconductor samples, such as three-dimensional (3D) NAND and DRAM, include repetitively appearing high aspect ratio features. For example, zillions of vertical memory channel holes are created by etching a stack of deposited layers. The small cross-sectional size and the large aspect ratio of these features pose challenges to understand the properties of these features for quality monitoring and process control. The existing fabrication inspection tools, such as optical critical dimension (OCD) system and critical dimension scanning electron microscope (CD-SEM), lack the imaging depth and signal extraction capability needed for 3D profiling of the high aspect ratio features. High resolution, high throughput, and fast profiling methods and systems for analyzing these features are needed.

SUMMARY

In one embodiment, a method for analyzing multiple features in a sample comprises acquiring a first image of a first surface of the sample including cross-sections of the multiple features; milling the sample to remove at least a part of the first surface and expose a second surface, wherein the second surface includes cross-sections of the multiple features at multiple sample depths relative to the first surface; acquiring a second image of the second surface; and constructing a 3D model of the multiple features by comparing the cross-sections of multiple features on the second surface in the second image with corresponding cross-sections of the multiple features on the first surface in the first image. In this way, the multiple features may be quickly analyzed, and properties of the features can be displayed based on the 3D model. In some embodiment, the method may be implemented using one or more charged particle tools.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION

Figure 1:
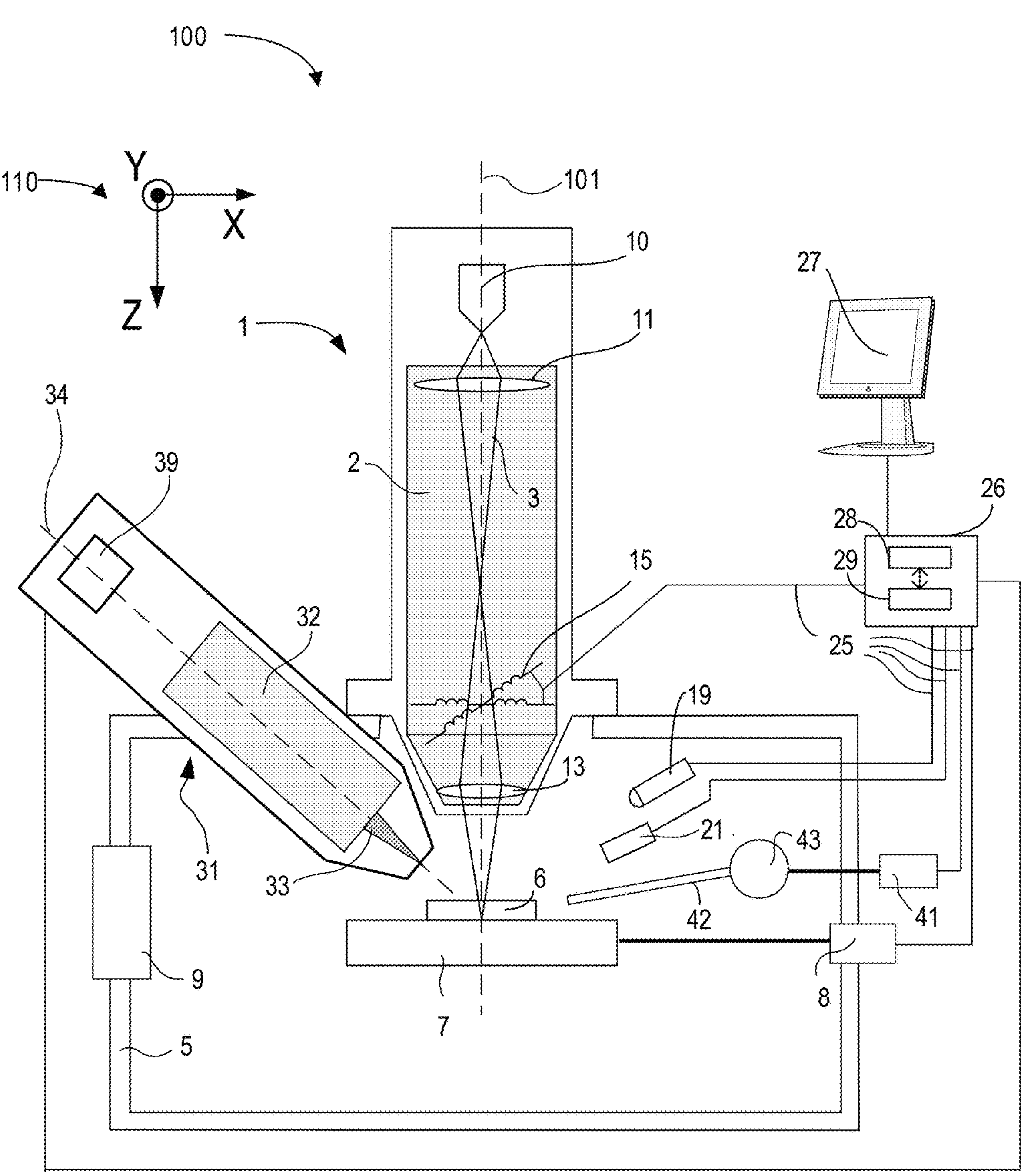
FIG. 1 illustrates a charged particle microscope, according to some embodiment.

The following description relates to systems and methods for analyzing multiple features in a sample. The features may be substantially identical in shape and size. The features may be regularly arranged side by side in the sample. In particular, the systems and methods disclosed herein can quickly analyze features with high aspect ratio. For example, the features may be channels or holes in a semiconductor sample, such as a memory sample. Analyzing the multiple features includes generating a 3D model indicating spatial distribution of the feature properties. The feature properties may include one or more of the size, shape, and the location of the feature. For example, the 3D model can show variation of the critical dimension (CD) metrology and/or the position of the features over various sample depths. The CD is the dimension of fine patterns formed on a semiconductor wafer, which is a key parameter in semiconductor fabrication process flow.

One method for generating a 3D profile of the high aspect ratio features is disclosed in U.S. patent application Ser. No. 17/177,529 by Zhong et al., filed on Feb. 17, 2021, which is herein incorporated by reference in its entirety and for all purposes, wherein the sample is repetitively and alternatively milled and imaged using an ion beam and an electron beam. Each sample image includes cross-sections of the features at a particular sample depth. The features' cross-sections identified from the sample images are combined to reconstruct the 3D profile. However, in order to obtain detailed information of hole characteristics, such as CD variations, bowing, twist, tilt, and kinking, that can result in columns touching and substantial bit failure, a large number of sliced surfaces with precise slice-to-slice alignment is needed. It may take tens of hours for acquiring a complete dataset covering a large sample region (for example, a sample region of 100×100 $um^2$).

Another method for generating a 3D model of the high aspect ratio features is disclosed in U.S. Pat. No. 10,026,590B2, by Stone et al, which is herein incorporated by reference in its entirety and for all purposes, which discloses exposing sample surfaces including cross-sections of multiple adjacent features via the glancing angle milling. Images of the cross-sections of the features in the exposed sample surface are assembled to form a 3D model that approximates one of the features. Applicant recognizes that the 3D model generated based on images of a single sample surface exposed by the glancing angle milling cannot show the shift of the feature's position over the sample depth. In order to obtain this information, similar to the method disclosed in the U.S. patent application Ser. No. 17/177,529, the time-consuming process of milling and acquiring images of multiple slices is required.

In order to address the above issues, multiple features in the sample are analyzed by comparing the cross-sections of each feature in at least two high resolution sample images, such as high-resolution scanning electron microscope (SEM) images. The first sample image includes cross-sections of the features at the same sample depth, and the second sample image includes cross-sections of the features at multiple sample depths. By comparing the cross-sections of the same feature in the first and second images, changes in the property of the feature may be extracted. For example, the change in CD and feature position in a plane normal to the sample depth can be obtained. The extracted feature properties of the multiple features may be combined to construct the 3D model.

The first sample image may be obtained by imaging a first surface, and the second sample image may be obtained by imaging the second surface of the sample. The first and second sample images may be SEM images acquired by directing the electron beam at a direction along the direction of the sample depth, normal to the first surface. The first surface may be exposed, via a delayering process, by removing materials from the sample using an ion beam. For cylindrical features, cross-sections of the features on the first surface may be substantially circular in shape. In one example, the materials are removed by a plasma focused ion beam (PFIB) directed normal towards the first surface. In another example, the materials are removed using an ion beam directed parallel to the first surface. The ion beam may be a broad beam for cross-sectional processing. For example, the beam profile of the broad ion beam is broader (or less focused) than the PFIB. The first surface should be relatively flat to facilitate analyzing the features in the first sample image. The flatness of the first surface may be assessed based on the contrast of the surface's image. After acquiring the first sample image, the second surface may be exposed by milling the sample to remove at least a part of the first surface with an ion beam. The ion beam may be generated from either a liquid metal ion source or a plasma ion source. The ion beam is directed towards the sample at an acute glancing angle relative to the first surface and is parallel to the second surface. The glancing angle may be 28-38 degrees. In one example, the ion beam is a focused ion beam (FIB). In another example, the ion beam is a broad ion beam. On the second surface, a feature cross-section located closer to the ion source is also closer to the first surface (that is, at a smaller sample depth) comparing to a different feature cross-section located farther away from the ion source (that is, at a larger sample depth). In one example, the multiple features that are imaged and used to generate the 3D models may each has a cross-section at a different sample depth on the second surface. In another example, a subset of the multiple features may have cross-sections at the same sample depth on the second surface. In some embodiments, the first and/or second sample images may be obtained by stitching multiple sample images of the first and/or second surface, respectively, to cover a larger region of interest.

Comparing the cross-sections of features from the first and second sample images includes identifying the cross-sections in the first and second sample images and mapping the identified cross-sections to the corresponding features. A fiducial of reference may be used for mapping the feature cross-sections. In one example, the fiducial may be created on the first surface. In another example, a structure of the sample or a part of the processed sample is used as a fiducial. The fiducial may be a cross-section of a feature on the first surface, which has not been removed by the glancing angle milling. The fiducial may alternatively be an edge created by the glancing angle milling. In some examples, the fiducial may be used for aligning the first and second sample images, and changes in the feature properties may be extracted from the aligned sample images.

For a particular feature of the multiple features, a first cross-section in the first sample image is compared with a second cross-section in the second sample image to determine changes in the feature's property. In one example, a position shift of the feature in a plane parallel to the first surface may be determined from the shift of the centers of the second cross-section from the centers of the first cross-section. The feature's locations (such as locations of the centers of the cross-section) may be determined utilizing the fiducial. In another example, change in radius of a particular feature may be calculated by comparing the estimated feature radius in the second sample image and the estimated feature radius in the first sample image. The extracted property change of each feature corresponds to a sample depth that equals the sample depth of the feature's cross-section on the second sample surface. The sample depth may be calculated from the glancing angle of the glancing angle milling and the distance of the cross-section from the edge on the first surface created by the glancing angle mill.

One or more 3D models of the multiple features may be generated from the changes in properties of the multiple features and the corresponding sample depths. For example, two dimensions (such as X and Y axes) of the model correspond to the property changes in a plane parallel to the first surface, and the third dimension (such as Z axis) of the model corresponds to the sample depth. Additionally, the 3D model may include metrologies of the features at various sample depths. For example, the 3D model may include estimated diameters of the features at the various sample depths. The 3D model may be constructed based on data from at least three different features.

In this way, the quality of the features may quickly be analyzed based on limited measurement data, for example, two sample images. This is extremely fast comparing to the method disclosed in the U.S. patent application Ser. No. 17/177,529, and can provide feature shift information that cannot be obtained from the method disclosed in the U.S. Pat. No. 10,026,590B2. Though the 3D model is generated from data extracted from multiple features, due to the similarity of the closely positioned features (such as the features located in the field of view of a single SEM image), the 3D model can accurately reflect or approximate the property of each feature. The disclosed method may be used for analyzing a sample extracted (such as cut out) from a larger/bulk sample. The method may also be used for directly analyzing features in a wafer. Different regions of the wafer may be analyzed using the disclosed method to extract regional feature property, and feature properties at various parts of the wafer (such as at the center and at the edge of the wafer) may be compared. The method can be used for monitoring the quality of the etching process during channel hole fabrication in 3D NAND manufacturing or during 3D capacitor fabrication in advanced DRAM manufacturing.

In some embodiment, multiple sample slices are removed via the glancing angle milling in order to expose the second surface. In some embodiment, after acquiring the second sample image, the sample is milled with the ion beam, to expose a third surface. A third sample image of the third surface is acquired. The 3D model may be generated based on the first, the second, and the third sample images.

Turning to FIG. 1, FIG. 1 is a highly schematic depiction of an embodiment of a dual-beam charged particle microscope (CPM) in which the present invention may be implemented; more specifically, it shows an embodiment of a FIB-SEM. System coordinates are shown as 110. Microscope 100 comprises a particle-optical column 1, which produces a beam 3 of charged particles (in this case, an electron beam) that propagates along a particle-optical axis 101. Particle-optical axis 101 may be aligned with the Z axis of the system. The column 1 is mounted on a vacuum chamber 5, which comprises a sample holder 7 and associated actuator(s) 8 for holding/positioning a sample 6. The vacuum chamber 5 is evacuated using vacuum pumps (not depicted). Also depicted is a vacuum port 9, which may be opened to introduce/remove items (components, samples) to/from the interior of vacuum chamber 5. Microscope 100 may comprise a plurality of such ports 9, if desired.

The column 1 comprises an electron source 10 and an illuminator 2. This illuminator 2 comprises lenses 11 and 13 to focus the electron beam 3 onto the sample 6, and a deflection unit 15 (to perform beam steering/scanning of the beam 3). The microscope 100 further comprises a controller/computer processing apparatus 26 for controlling inter alia the deflection unit 15, lenses 11, 13 and detectors 19, 21, and displaying information gathered from the detectors 19, 21 on a display unit 27.

In addition to the electron column 1 described above, the microscope 100 also comprises an ion-optical column 31. This comprises an ion source 39 and an illuminator 32, and these produce/direct an ion beam 33 along an ion-optical axis 34. To facilitate easy access to sample 6 on holder 7, the ion axis 34 is canted relative to the electron axis 101. As hereabove described, such an ion (FIB) column 31 can, for example, be used to perform processing/machining operations on the sample 6, such as incising, milling, etching, depositing, etc. The ion column 31 can also be used to produce imagery of the sample 6. It should be noted that ion column 31 may be capable of generating various different species of ion at will; accordingly, references to ion beam 33 should not necessarily been seen as specifying a particular species in that beam at any given time—in other words, the beam 33 might comprise ion species A for operation A (such as milling) and ion species B for operation B (such as implanting), where species A and B can be selected from a variety of possible options. The ion source 39 may be a liquid metal ion source or a plasma ion source.

Also illustrated is a Gas Injection System (GIS) 43, which can be used to effect localized injection of gases, such as etching or precursor gases, etc., for the purposes of performing gas-assisted etching or deposition. Such gases can be stored/buffered in a reservoir 41, and can be administered through a narrow nozzle 42, so as to emerge in the vicinity of the intersection of axes 101 and 34, for example.

The detectors 19, 21 are chosen from a variety of possible detector types that can be used to examine different types of "stimulated" radiation emanating from the sample 6 in response to irradiation by the (impinging) beam 3 and/or beam 33. Detector 19 may be a solid-state detector (such as a photodiode) that is used to detect ion induced photon emission and/or cathodoluminescence emanating from the sample 6. It could alternatively be an X-ray detector, such as Silicon Drift Detector (SDD) or Silicon Lithium (Si(Li)) detector, for example. Detector 21 may be an electron detector in the form of a solid-state photomultiplier (SSPM) or evacuated photomultiplier tube (PMT) for example. This can be used to detect backscattered and/or secondary electrons emanating from the sample 6. The skilled artisan will understand that many different types of detector can be chosen in a set-up such as that depicted, including, for example, an annular/segmented detector. By scanning the beam 3 or beam 33 over the sample 6, stimulated radiation—comprising, for example, X-rays, infrared/visible/ultraviolet light, secondary ions, secondary electrons (SEs) and/or backscattered electrons (BSEs)—emanates from the sample 6. Since such stimulated radiation is position-sensitive (due to said scanning motion), the information obtained from the detectors 19 and 21 will also be position-dependent.

The signals from the detectors 19 and 21 pass along control lines (buses) 25, are processed by the controller 26, and displayed on display unit 27. Such processing may include operations such as combining, integrating, subtracting, false coloring, edge enhancing, and other processing known to the skilled artisan. In addition, automated recognition processes may be included in such processing. The controller includes a non-transitory memory 29 for storing computer readable instructions and a processor 28. Methods disclosed herein may be implemented by executing the computer readable instructions in the processor. For example, the controller may control the microscope for milling and imaging the sample, collecting data, and processing the collected data for generating the 3D model of the features inside the sample. The controller may output images based on the 3D model. In some embodiments, data collected from the sample and/or the 3D models of the sample may be locally or remotely stored. The stored data may be processed remotely using a computer not part of the microscope for generating the 3D model.

In some embodiments, the sample may be pre-processed in a first tool and further processed or imaged in a second tool. For example, the sample may be pre-processed in a first tool (such as a broad ion beam processing tool) to expose a first surface and transferred to a second tool (such as a charged particle microscope) for imaging and milling. In some embodiments, instead of a FIB column, the charged particle microscope may include a broad ion beam processing tool for the milling.

Figure 2:
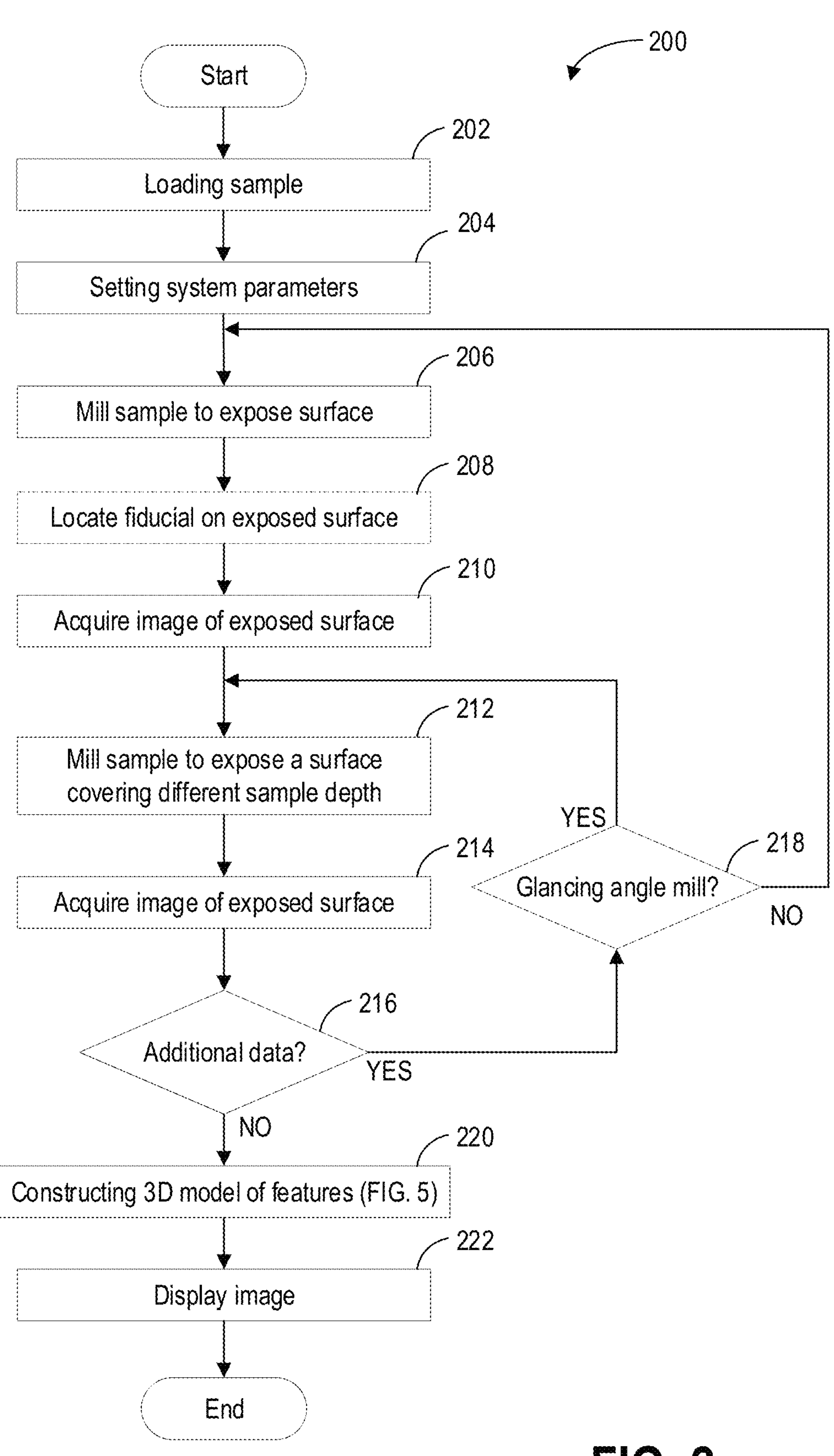
FIG. 2 is a flowchart of a method for analyzing multiple features of a sample.

FIG. 2 shows method 200 for analyzing multiple features in a sample using a charged particle tool, such as the charged particle microscope 100 of FIG. 1. At least one 3D model of feature properties is generated by comparing a first image of a first surface of the sample with a second image of a second surface of the sample, wherein the distances of cross-sections of at least two features on the second surface are different from their respective cross-sections on the first surface.

At 202, the sample is loaded into the sample chamber. The sample may be a part of a wafer or an entire wafer. After loading the sample, one or more images of the sample may be acquired to determine and locate a region of interest (i.e. a region defined in the X-Y plane according to the sample's coordinates). The sample may then be positioned and oriented towards a charged particle beam.

At 204, the system parameters are set for analyzing the features. The system parameters may include one or more of beam currents, beam profiles, and incident angles of the ion and electron beams. The system parameters may further include milling and scanning pattern and milling depth.

At 206, the region of interest on the sample surface is milled using the ion beam to expose cross-sections of multiple features of the sample. The process of removing sample layers normal to the sample depth is herein referred to as a delayering process. For example, the first channel hole layer of a 3D NAND sample can be exposed by removing the contact layer covering the channel hole layer via the delayering process. On the surface exposed by the delayering process, feature cross-sections may be substantially normal to the direction that the features extend along.

Figures 3A, 3B, 3C:
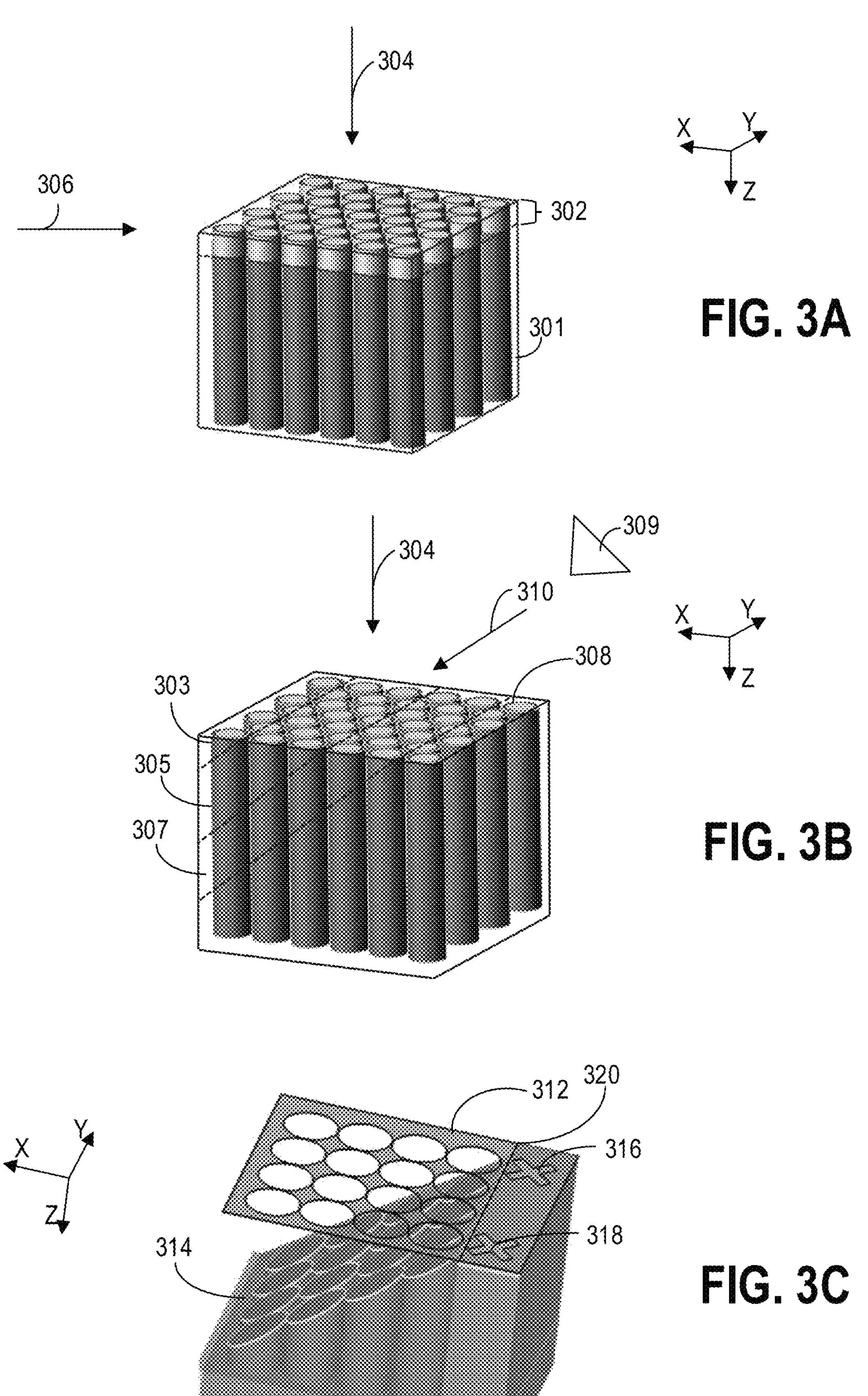
FIG. 3A illustrates a delayering process.
FIG. 3B illustrates a glancing angle milling process.
FIG. 3C illustrates sample surfaces from which high-resolution images are taken.
Figure 4A:
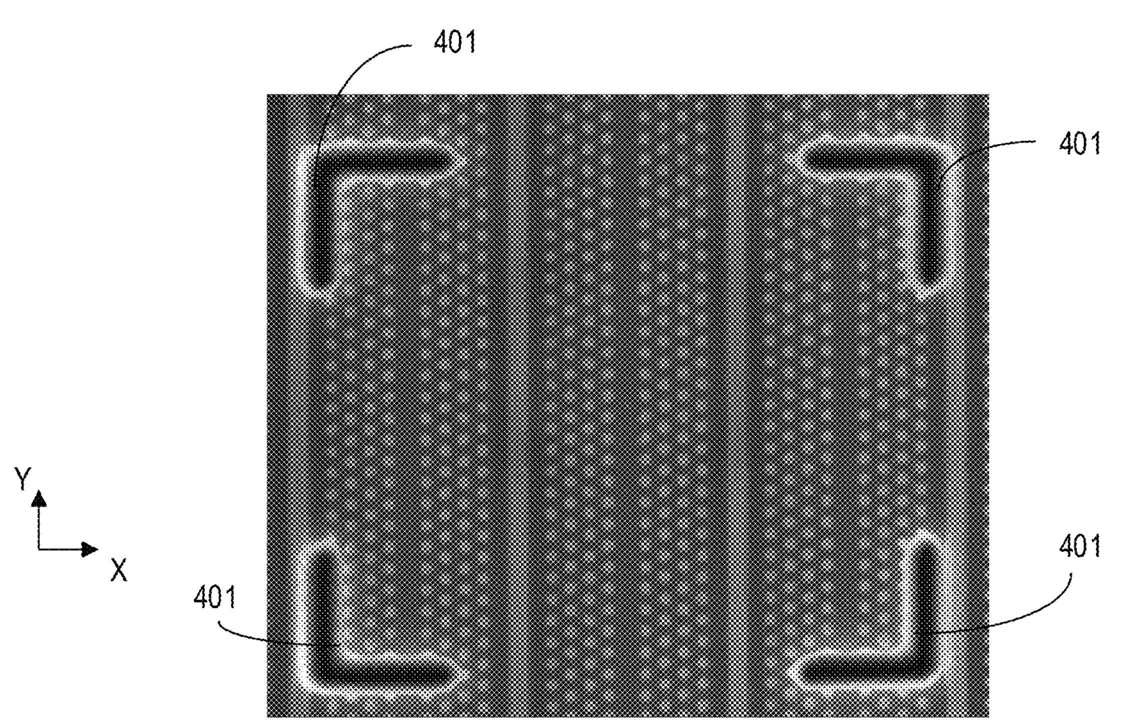
FIG. 4A and FIG. 4B show SEM images taken before and after the glancing angle milling of a sample, respectively.

The delayering process is illustrated in FIG. 3A, wherein a top layer 302 of sample 301 is removed with an ion beam. In one example, the top layer 302 is removed with a PFIB directed along a direction 304 normal to the X-Y plane according to the sample's coordinates. In another example, the top layer 302 is removed with a broad ion beam directed along a direction 306 parallel to the X-Y plane of the sample. One advantage of using PFIB or broad ion beam over the FIB from a liquid metal ion source (such as Ga+ ion) is the higher surface flatness, which is critical for accurately analyzing the feature properties. Further, the material removal rate for the PFIB and the broad ion beam is higher than the FIB from a liquid metal ion source. In one embodiment, the delayering process may be terminated when a pre-determined thickness of top layer has been removed. For example, the milling may be terminated after a pre-determined duration estimated based on one or more of the material removal rate, the dwell time, and the scan pattern. In another embodiment, the delayering process may be monitored based on signals collected responsive to milling using PFIB. For example, the delayering process stops when the signals responsive to PFIB milling show top surface of features. In yet another embodiment, the delayering process may be monitored with SEM imaging and/or images acquired responsive to FIB milling. The delayering process may be terminated responsive to reaching a user-defined first surface. For example, the delayering process may be terminated responsive to exposing the top layer of the features under investigation. FIG. 4A shows an example of exposed first surface after delayering. Multiple cross-sections of features are shown in the 5 um by 5 um field of view. Fiducials 401 are created on the surface using the ion beam. In some embodiments, if the sample has been pre-prepared or the top surface of the features are already exposed, step 206 may be skipped.

At 208, one or more fiducials is optionally located on the exposed surface. Locating the fiducial includes identifying the fiducial and/or creating the fiducial. The fiducials may locate in a region that will not be affected/removed by the following milling. In one example, the fiducial is an existing structure on the exposed surface, such as a cross-section of a particular feature. In another example, the fiducial is created using the ion beam on the exposed surface. In yet another example, the fiducial is a structure, such as an edge, created by the glancing angle milling at 212.

At 210, a high-resolution sample image of the exposed surface is acquired. The SEM image may be acquired with the electron beam normal to the exposed surface, such as along direction 304 of FIG. 3A. If a fiducial has been determined at 208, the fiducial may be included in the field of view of the sample image.

At 212, at least a part of the exposed surface from step 206 is milled with an ion beam directed at an acute glancing angle relative to the exposed surface. For example, as shown in FIG. 3B, the exposed surface 308 resulted from delayering at step 206 is milled using the ion beam directed along direction 310. Direction 310 is at an acute angle relative to surface 308. The ion beam may be the PFIB or the broad ion beam. The FIB may scan along the Y direction multiple times to remove multiple slices (such as slices 303, 305, and 307) of the sample to expose the second surface. The sample depth increases as indicated by the arrow of Z axis. The surface exposed by the glancing angle milling has a lower sample depth closer to the ion source 309 and a higher sample depth further from the ion source. As a result of the glancing angle milling, cross-sections of the features on the exposed surface are at varied sample depths.

FIG. 3C illustrates the relative positions of the first surface 312, for example created from step 206, the second surface after the glancing angle milling at 212, and the fiducials 316 and 318 on the first surface. The fiducials may be created at step 208.

Figure 4B:
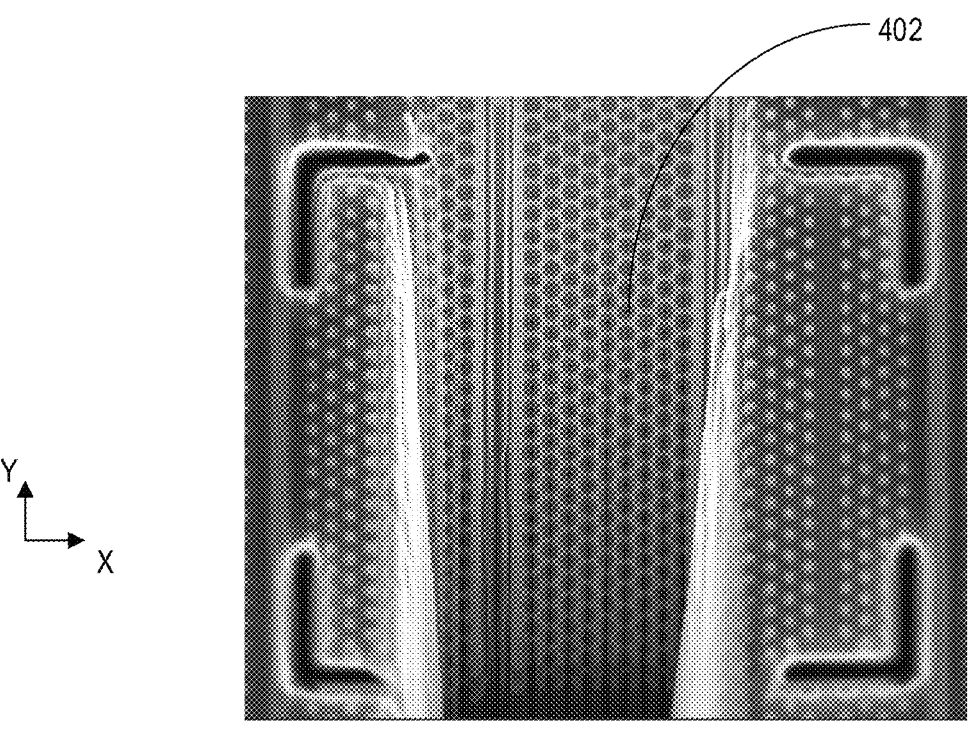

At 214, another high-resolution sample image, such as a SEM image, is acquired for the newly exposed surface. The SEM image may be acquired by directing the electron beam in the direction normal to the exposed surface from step 206, in the same direction for acquiring the image at 210. The SEM image may be acquired by dynamically focusing the electron beam based on estimated sample depth at the irradiated sample location. The sample depth can be estimated based on the glancing angle used at 212. FIG. 4B shows a SEM image acquired after glancing angle milling the surface shown in FIG. 4A. Trench 402 was created by the milling. Multiple cross-sections of the features at various sample depths were captured in FIG. 4B. With increased sample depth (against the Y direction), the resolution of the cross-section decreases.

At 216, method 200 determines whether additional data are required.

For example, additional data may be required if the deeper features need to be analyzed. If more data are to be acquired, method 200 proceeds to 218 to further milling the sample. Otherwise, method 200 proceeds to 220.

At 218, method 200 checks what kind of milling is needed. If glancing angle milling is needed to expose features' cross-sections at the greater sample depth, the exposed surface is further milled with glancing angle milling at 212. Alternatively, the sample may be processed with ion beam normal to the first surface (X-Y plane of sample coordinates) at 206 before any further glancing angle milling.

At 220, 3D model of the features is constructed by comparing the sample image acquired at 210 and one or more sample images acquired after the glancing angle milling at 214. Comparing the sample images includes extracting feature properties by comparing the feature's cross-sections in the sample images. The details for constructing the 3D model is shown in FIG. 5.

Figure 7:
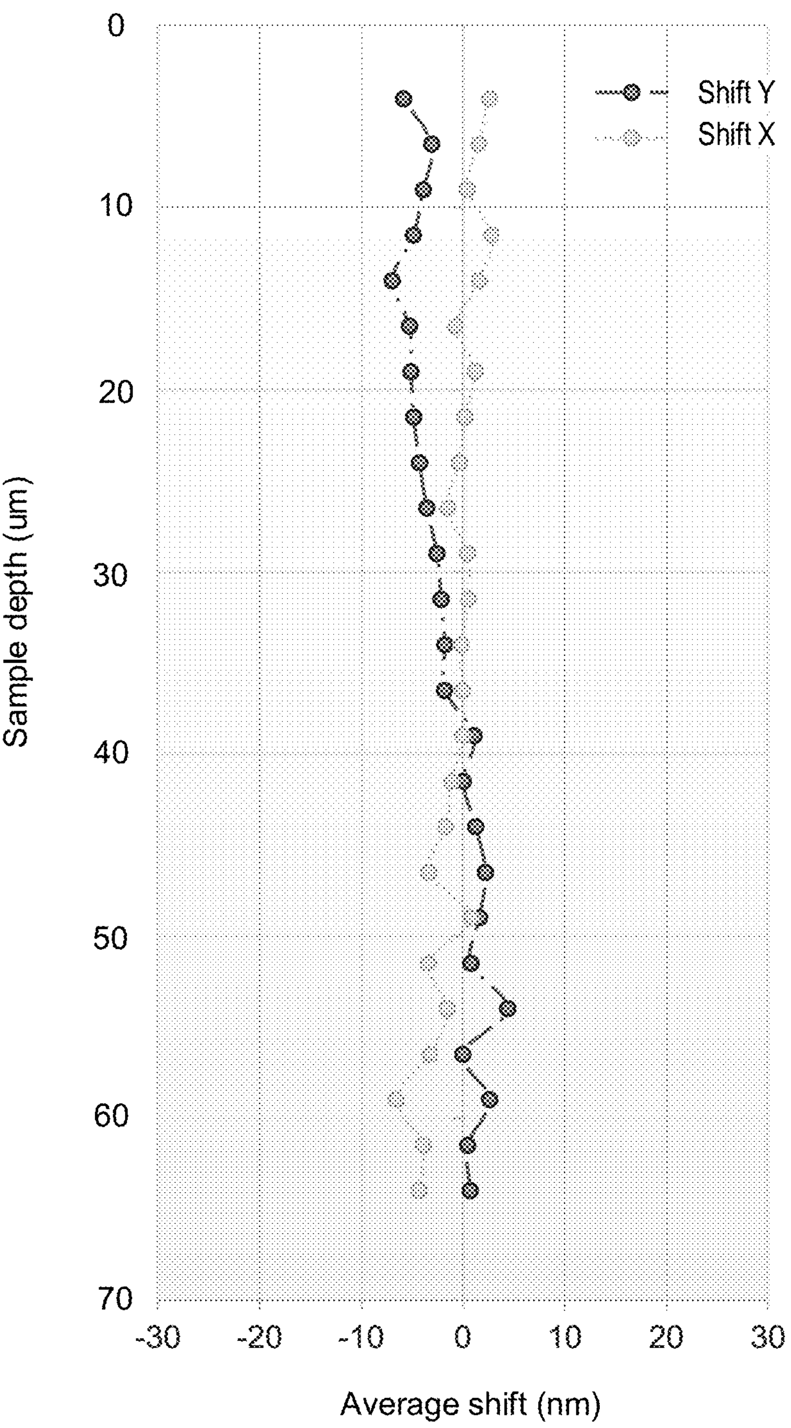
FIG. 7 is an example image showing position shift of the features over sample depth.
Figure 8:
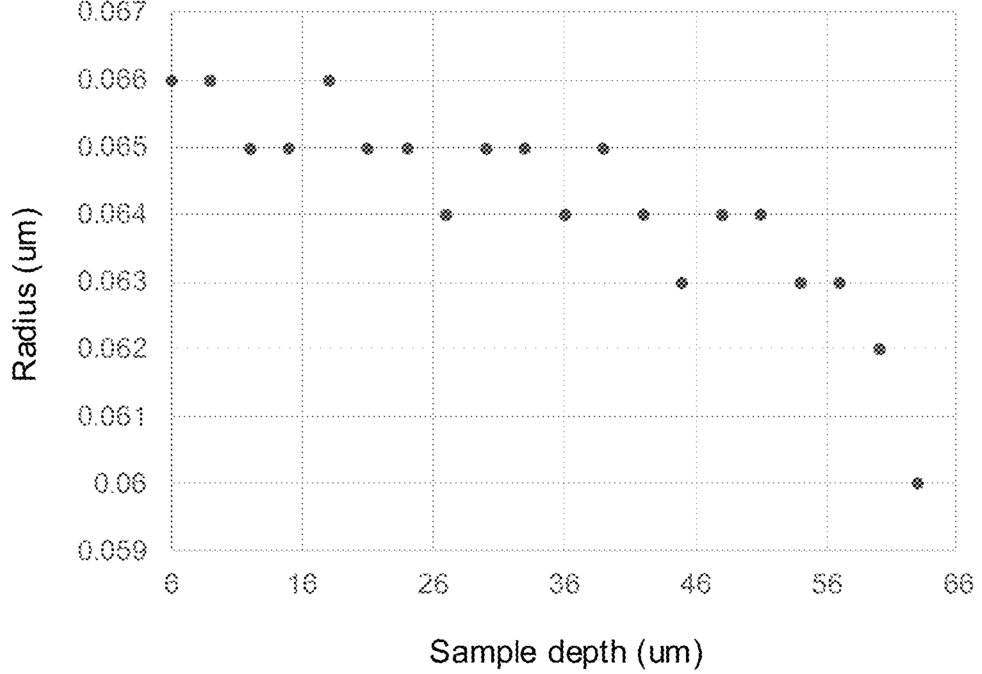
FIG. 8 is an example image showing the change in the radius of the features over sample depth.

At 222, one or more images may be generated and displayed based on the 3D model. The images may show variation of one or more feature properties over the sample depth. In one example, FIG. 7 shows the average shift of the feature position in the X and Y directions according to the sample's coordinates over the sample depth (i.e. Z axis according to the sample's coordinates) in a NAND sample. The position shift of the features is within a range of ten nanometers, and the sample depth is within a range of tens of microns. FIG. 7 was generated based on two SEM images. This fast feature profiling drastically decreases the total sample analyzing time and provides quick feedback with not only qualitative but also quantitative information to guide production control. FIG. 8 shows another example of the change in feature's radius over the sample depth. In some example, multiple sample properties can be displayed in a single image.

Figure 5:
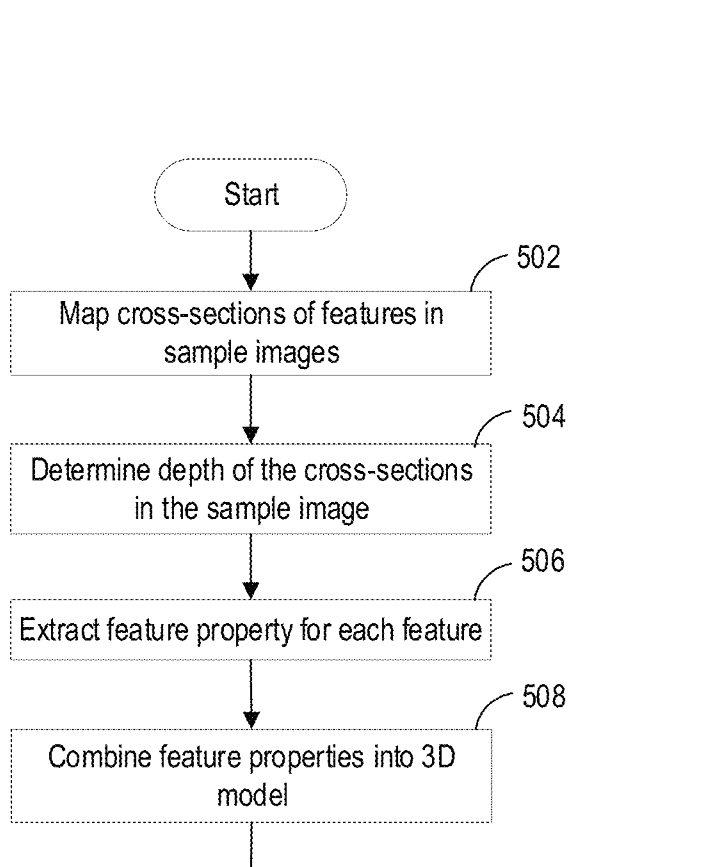
FIG. 5 shows method 500 for constructing a 3D model of the features.

FIG. 5 shows method 500 for constructing the 3D model based on the sample images. As a non-limiting example, the 3D model is constructed from two sample images. The first sample image includes feature cross-sections at the same sample depth and the second sample image includes feature cross-sections at multiple sample depths. For example, the first sample image is taken from first surface 312 in FIG. 3C and the second sample image is taken from second surface 314 in FIG. 3C.

Figure 6A:
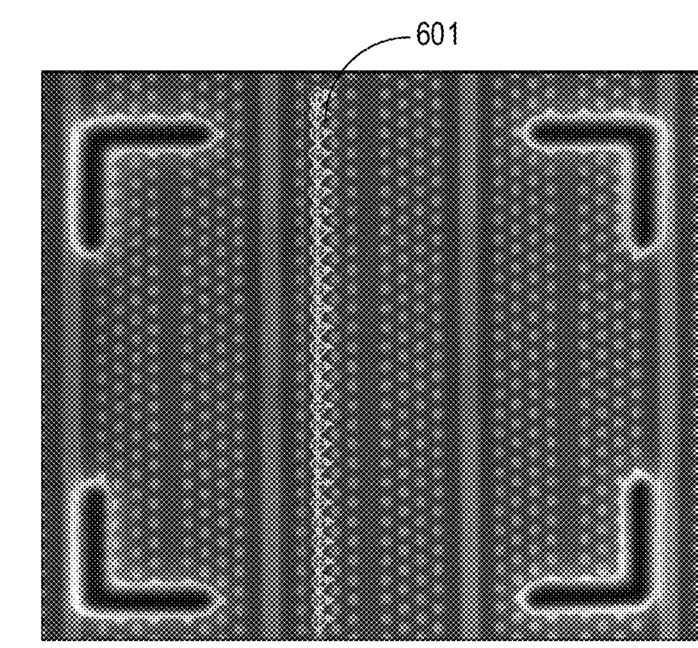
FIG. 6A and FIG. 6B show identified feature cross-sections in FIG. 4A and FIG. 4B, respectively.
Figure 6B:
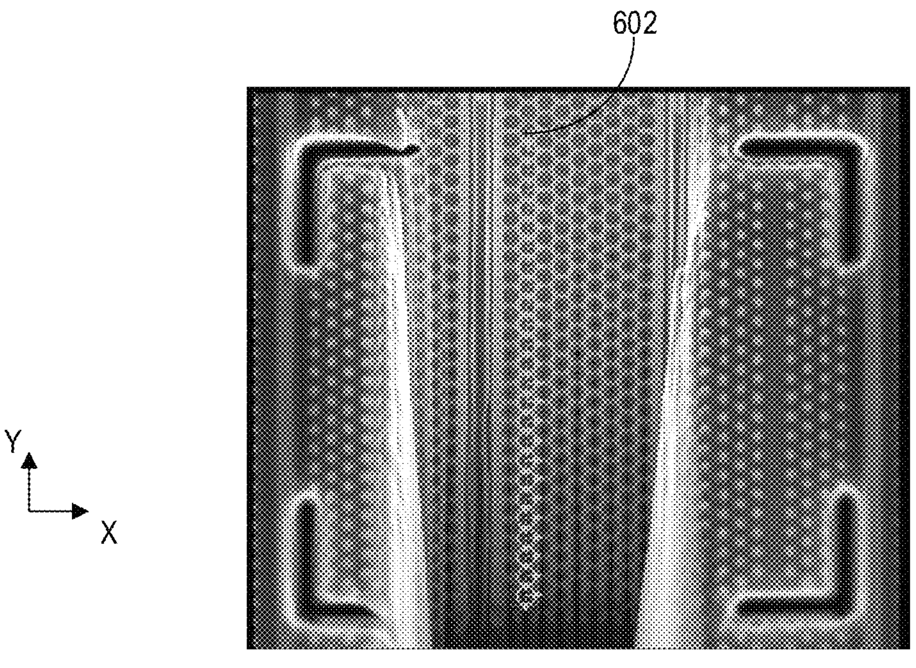

At 502, the cross-sections in the sample images are mapped to corresponding features. Mapping the cross-sections to the features include identifying cross-sections in the sample images. The cross-sections in the sample image may be manually or automatically identified using an image reorganization algorithm, based on prior knowledge of the shape of the features. For example, the cross-sections in the sample image may be identified using a machine learning algorithm. The identified cross-sections may be mapped to the features based on their position relative to a fiducial in the sample images. The fiducial may be a feature on the first surface that is milled during the glancing angle milling. The fiducial may alternatively be an edge on the first surface which formed by the glancing angle milling, such as edge 320 in FIG. 3C. FIG. 6A and FIG. 6B show a column of cross-sections (601 and 602) identified in sample images FIG. 4A and FIG. 4B. The cross-sections of the same feature may be identified based on the order or sequence of the cross-section from the reference cross-section (i.e. fiducial) in the sample images. For example, the $10^{th}$ cross-sections from the fiducial along the Y axis correspond to the same feature.

At 504, the sample depth of the cross-section in the second image is calculated. The sample depth may be calculated based on the glancing angle and a distance of the cross-section from the edge on the first surface which formed by the glancing angle milling, such as edge 320 in FIG. 3C. The distance may be estimated in the second image.

At 506, one or more feature properties of the multiple features are extracted from the two sample images. In one example, the feature property includes the position shift of the feature. The position shift of a feature may be obtained by comparing the positions of a first center of a first identified cross-section corresponding to the feature in the first image and a second center of a second identified cross-section corresponding to the feature in the second image. Each position shift also corresponds to a sample depth that is the sample depth of the second identified cross-section. In another example, the feature property includes the radius of the feature. The radius of a feature may be determined from the identified feature cross-section in the second image. The sample depth associated with the radius is the sample depth of the identified cross-section in the second image.

At 508, the feature properties of the multiple features are combined to form the 3D model. The 3D model is a dataset that records the change of feature properties over the sample depth.

In some embodiments, additional sample images are taken of surfaces parallel to the second sample image. Feature properties may be extracted from these additional sample images similarly as in method 500 and included in the 3D model.

In this way, regularly spaced features in the sample may be analyzed after quick delayering and glancing angle milling. The property of each feature is sparsely sampled at one (or a few) sample depth to approximate the overall property of features. The method enables analyzing feature properties in large sample area (such as a wafer) and provide quick feedback to the production process.

What is claimed is:

1. A method for analyzing multiple features in a sample, comprising:

acquiring a first image of a first surface of the sample including cross-sections of the multiple features, wherein the first surface is normal to a direction of a sample depth, and wherein the first image is acquired with a first charged particle beam directed along the direction of the sample depth, normal to the first surface;

milling the sample using a second charged particle beam, to remove at least a part of the first surface and expose a second surface, wherein the second surface includes cross-sections of the multiple features, and the cross-sections of the multiple features are at multiple sample depths relative to the first surface;

acquiring a second image of the second surface with the first charged particle beam directed along the direction of the sample depth; and constructing a 3D model of the multiple features by comparing the cross-sections of multiple features on the second surface in the second image with corresponding cross-sections of the same multiple features on the first surface in the first image.

2. The method of claim 1, further comprising displaying the constructed 3D model.

3. The method of claim 1, wherein comparing the cross-sections of multiple features on the second surface in the second image with corresponding cross-sections of the multiple features on the first surface in the first image includes comparing a cross-section of a particular feature imaged in the second image with a cross-section of the feature imaged in the first image.

4. The method of claim 1, wherein comparing the cross-sections of multiple features on the second surface in the second image with corresponding cross-sections of the multiple features on the first surface in the first image includes comparing one or more of a position of the cross-sections of multiple features on the second surface with corresponding cross-sections of the multiple features on the first surface.

5. The method of claim 1, wherein comparing the cross-sections of multiple features on the second surface in the second image with corresponding cross-sections of the multiple features on the first surface in the first image includes identifying the cross-sections of the features in the first and second images.

6. The method of claim 5, wherein comparing the cross-sections of multiple features on the second surface in the second image with corresponding cross-sections of the multiple features on the first surface in the first image further includes mapping the identified cross-sections to corresponding features.

7. The method of claim 6, further comprising locating a fiducial on the first surface, and the identified cross-sections are mapped to corresponding features utilizing the fiducial.

8. The method of claim 1, further comprising locating a fiducial on the first surface, and determining the sample depth of the cross-sections of the multiple features on the second surface based on distances of the cross-sections of the multiple features on the second surface from the fiducial in the second image.

9. The method of claim 1, further comprising milling the sample with plasma focused ion beam (PFIB) to expose the first surface before acquiring the first image of the first surface.

10. The method of claim 1, further comprising milling the sample with an ion beam directed along an axis parallel to the first surface to expose the first surface before acquiring the first image of the first surface.

11. The method of claim 1, wherein each feature of the multiple features extends in a direction along the sample depth.

12. The method of claim 1, wherein the sample is milled with the second charged particle beam at an acute angle relative to the first surface, and the second charged particle beam is parallel to the second surface.

13. A charged particle system for analyzing multiple features in a sample, comprising:

a first source for generating a first charged particle beam towards the sample;

a second source for generating a second charged particle beam towards the sample;

a detector for collecting particles emitted from the sample responsive to irradiating the sample with the first charged particle beam;

a controller including a processor and a non-transitory memory for storing computer readable instructions, by executing the computer readable instructions in the processor, the charged particle system is configured to:

direct, via the first source, the first charged particle beam towards the sample;

acquire, via the detector, a first image of a first surface of the sample including first cross-sections of the multiple features, wherein the first surface is normal to a direction of a sample depth, and wherein the first image is acquired with the first charged particle beam directed along the direction of the sample depth, normal to the first surface;

mill, via the second source, the sample to remove at least a part of the first surface and expose a second surface, wherein the second surface includes second cross-sections of the multiple features, and the second cross-sections of the multiple features are at different sample depths relative to the first surface;

direct, via the first source, the first charged particle beam towards the sample along the direction of the sample depth;

acquire, via the detector, a second image of the second surface; and construct a 3D model of the multiple features by comparing the second cross-sections of the multiple features in the second image with the corresponding first cross-sections of the same multiple features in the first image.

14. The system of claim 13, wherein the first source generates an electron beam, and the second source generates an ion beam.

15. The system of claim 14, wherein the first and second images are scanning electron microscopy images.

16. The system of claim 13, further comprising a display unit, and the system is further configured to display an image of the constructed 3D model on the display unit.

17. The system of claim 13, wherein the first and/or second sample images are stitched together from multiple images acquired from the first surface and/or second surface, respectively.

18. The system of claim 13, wherein the 3D model includes position shift of the multiple features at the multiple sample depths.

19. The method of claim 1, wherein the multiple features comprise high aspect ratio features regularly arranged side by side in the sample.

* * * * *